United States Patent
Fujiishi et al.

(10) Patent No.: US 8,347,494 B2
(45) Date of Patent: Jan. 8, 2013

(54) ELECTRONIC COMPONENT MOUNTING METHOD

(75) Inventors: Yusaku Fujiishi, Kawasaki (JP); Hiroshi Shimamori, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 326 days.

(21) Appl. No.: 12/570,092

(22) Filed: Sep. 30, 2009

(65) Prior Publication Data
US 2010/0084164 A1  Apr. 8, 2010

(30) Foreign Application Priority Data
Oct. 2, 2008 (JP) .................................. 2008-256919

(51) Int. Cl.
*H05K 3/34* (2006.01)
(52) U.S. Cl. ............... 29/840; 29/743; 29/744; 29/832; 228/180.21
(58) Field of Classification Search ............... 219/85.12, 219/85.13; 228/6.2, 180.1, 180.21, 212, 228/18.21; 324/750.21, 763.01; 29/830–832, 29/834, 840, 843, 743, 744, 760
See application file for complete search history.

(56) References Cited

U.S. PATENT DOCUMENTS
5,915,749 A * 6/1999 Baldwin .................... 29/840
6,049,656 A * 4/2000 Kim et al. ............... 228/180.1

FOREIGN PATENT DOCUMENTS
JP  56-152243  11/1981
JP  7-42126    7/1995
JP  2001-267367  9/2001

OTHER PUBLICATIONS
Japanese Office Action issued Aug. 28, 2012 in corresponding Japanese Patent Application No. 2008-256919.

* cited by examiner

*Primary Examiner* — Donghai D. Nguyen
(74) *Attorney, Agent, or Firm* — Staas & Halsey LLP (57) ABSTRACT

A mounting method for mounting an electronic component on a printed circuit board, the mounting method includes fixing a lower surface of a magnet panel to a magnetic body included in the electronic component by a magnetic force, seizing the electronic component by attracting a part of an upper surface of the magnet panel to an attaching unit, determining a position of the attracting unit to place the electronic component at a predetermined position with respect to the printed circuit board and releasing the attracting unit from the upper surface of the magnet panel.

20 Claims, 6 Drawing Sheets

ELECTRONIC COMPONENT MOUNTING METHOD

CROSS-REFERENCE TO RELATED APPLICATION

This application is based upon and claims the benefit of priority of the prior Japanese Patent Application No. 2008-256919 filed on Oct. 2, 2008, the entire contents of which are incorporated herein by reference.

FIELD

A certain aspect of the embodiments discussed herein relates to an electronic component mounting method.

BACKGROUND

As a technology to mount an electronic component on the printed board, there is a SMT (Surface Mount Technology). In the SMT, a printed board having a paste-state solder applied thereon for mounting a SMD (Surface Mount Device) is prepared. Then, the SMD is mounted on the printed board with a chip mounter. Subsequently, the solder is heated and melted in a high-temperature furnace (reflow furnace), and the SMD is welded on the printed board.

As one of technologies for handling the electronic component with the chip mounter, there is a technology to handle the electronic component by attracting the same by a magnetic force with a magnet chuck. However, when using an electromagnet, a magnetic metal material is necessary on the side of the electronic component, so that it lacks general versatility in practical terms.

As another technology to handle the electronic component with the chip mounter, there is a technology to handle the electronic component by attracting the same with a sucking head. The chip mounter employing this technology includes a sucking head which is movable between the position to arrange the printed board and the position to arrange the SMD. A sucking nozzle configured to attract the SMD is provided at a distal end of the sucking head. The chip mounter is able to transport the SMD to a predetermined position on the printed board by causing the attracting nozzle to attract the SMD.

Since many electronic components have a flat surface on a top thereof, it is possible to attract the SMD by the sucking head. In addition, by changing the size of the sucking nozzle according to the size of the electronic component, it covers the electronic components in various sizes, so that the general versatility is secured.

Incidentally, the SMD which is mounted on the printed board by the SMT includes large-sized electronic components such as a DC-DC (Direct Current-Direct Current) converter. When such large-sized SMD is mounted on the printed board with the chip mounter employing the sucking nozzle, if the position of attraction of the sucking nozzle is displaced from a center portion, the component is hard to maintained horizontally, and hence it is difficult to position the sucking nozzle accurately to a predetermined position. Therefore, for the large-sized SMD, it is necessary to provide a flat portion at the center portion thereof for being attracted by the sucking nozzle. In general, a productions design such as to secure a flat space on the center portion of the substrate or to arrange a component having a flat surface on the top thereof at the center of the SMD is desired.

However, due to a constraint in productions design, there arise the following problems.

1) Dead spaces tend to be formed, which hinders downsizing.
2) Optimal arrangement of the component in terms of electricity, cooling property, and structure cannot be achieved, which results in lowering of the function.

If the flat portion is hard to form in the center portion of the SMD, alternative means is desired. For example, a method of causing the SMD to be attracted to a double sucking nozzle (a head having two sucking nozzles) or a method of forming the flat portion by affixing an adhesive tape or the like is contemplated. Such methods have the following problems and hence the general versatility is not expected.

3) The method of causing the SMD to be attracted to the double sucking nozzles requires special manufacturing equipment, and a burden of capital spending is excessive.
4) For the method of forming the flat portion by affixing the adhesive tape or the like, a manner to affix the adhesive tape is difficult. In addition, an adhesive agent remains on the component side after a reflow, so that a number of steps are required for removing the remaining adhesive tape.

[Patent Document 1] Japanese Laid-open Patent Publication No. 56-152243
[Patent Document 2] Japanese Laid-open Patent Publication No. 2001-267367

SUMMARY

According to an aspect of an embodiment, a mounting method for mounting an electronic component on a printed circuit board, the mounting method includes fixing a lower surface of a magnet panel to a magnetic body included in the electronic component by a magnetic force, seizing the electronic component by attracting a part of an upper surface of the magnet panel to an attaching unit, determining a position of the attracting unit to place the electronic component at a predetermined position with respect to the printed circuit board and releasing the attracting unit from the upper surface of the magnet panel.

The object and advantages of the invention will be realized and attained by means of the elements and combinations particularly pointed out in the claims.

It is to be understood that both the forgoing general description and the following detailed description are exemplary and explanatory and are not restrictive of the invention, as claimed.

DESCRIPTION OF EMBODIMENTS

Referring now to the drawings, embodiments of the present invention will be described.

A first embodiment is configured in such a manner that a magnet panel is fixed on a magnetic component on a SMD by a magnetic force.

Figure 1:
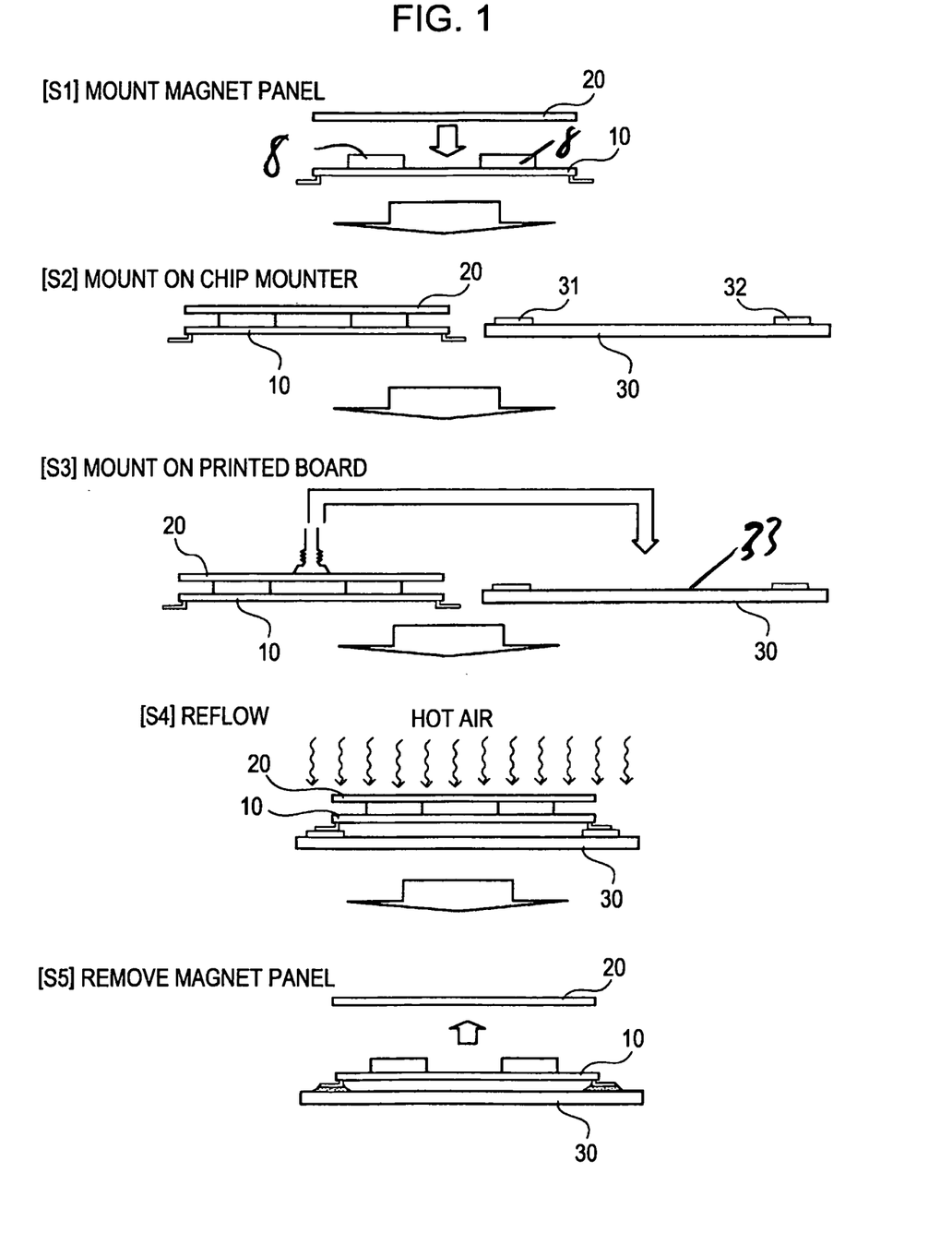
FIG. 1 is a drawing illustrating a procedure of manufacturing an electronic circuit module having a SMD mounted thereon.

FIG. 1 is a drawing depicting a procedure of manufacturing an electronic circuit module having the SMD mounted thereon. First of all, a magnet panel 20 is mounted on a large-sized SMD 10 (Step S1). The magnetic component 8 including a magnetic substance is mounted on the SMD 10, and the magnet panel 20 is fixed to the magnetic component 8 by the magnetic force. The magnet panel 20 is a panel-shaped permanent magnet.

Subsequently, the SMD 10 and a printed circuit board 30 are mounted at predetermined positions of a chip mounter (Step S2). For example, the SMD 10 is arranged in a tray for chip mounter components. The printed circuit board 30 is installed at an electronic component mounting position by a substrate transfer mechanism (loader). Paste-state solders 31, 32 are applied on an upper surface of the printed circuit board 30. In this embodiment, the surface on the side on which the SMD 10 is to be mounted by reflow soldering is referred to as the "upper surface" 33 of the printed circuit board 30.

Subsequently, the SMD 10 is mounted on the printed circuit board 30 with the chip mounter (Step S3). In this case, to lift the SMD 10, the chip mounter attracts a center portion of the upper surface of the magnet panel 20 mounted on the upper portion of the SMD 10. Then, the chip mounter positions the SMD 10 at a predetermined position on the printed circuit board 30. The chip mounter releases a nozzle of the chip mounter from the upper surface of the magnet panel so as to leave the SMD 10 on the printed circuit board 30.

Subsequently, reflow soldering is performed (Step S4). In other words, the printed circuit board 30 having the SMD 10 mounted thereon is delivered to a reflow furnace and, in the reflow furnace, hot air is blown onto the printed circuit board 30. Accordingly, the SMD 10 is soldered to the printed circuit board 30. Finally, the magnet panel 20 is removed from the SMD 10 (Step S5).

The electronic circuit module having the SMD 10 mounted thereon is manufactured in this procedure.

The permanent magnet used in the magnet panel 20 includes ferrite magnet, samarium-cobalt magnet, and neodymium magnet, for example. The permanent magnet used in the magnet panel 20 is determined according to the weight of the SMD 10, the size of the magnetic component, and ease of becoming magnetized. For example, if the magnetic component is small, a permanent magnet having a strong magnetic force such as the neodymium magnet or samarium-cobalt magnet is used as the magnet panel 20.

When the maintenance of the magnetic force after being subjected to the reflow soldering is considered, for example, a substance having a high maximum usable temperature such as samarium-cobalt magnet is suitable for the magnetic panel 20. If the magnetic force of the magnet panel 20 is sufficiently maintained after the reflow soldering, repetitive usage of the magnet panel 20 is achieved.

A method of mounting the SMD will be described in detail.

Figure 2:
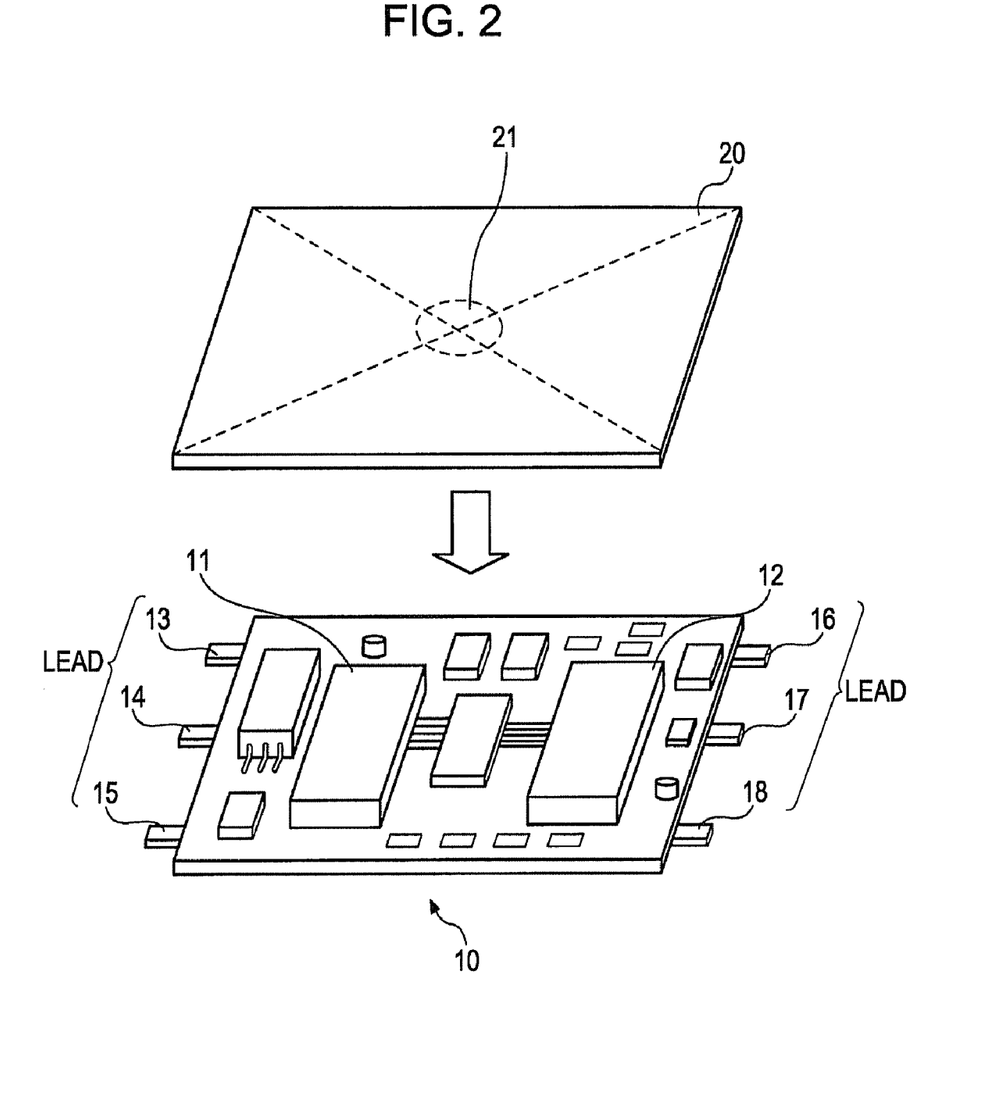
FIG. 2 is a drawing illustrating a mounting state of a magnet panel to the SMD.

FIG. 2 is a drawing depicting a mounting state of a magnet panel to the SMD. An electronic component including an inductor 11 and a transformer 12 is mounted on top of the SMD 10. The inductor 11 and the transformer 12 are magnetic components. In other words, the inductor 11 and the transformer 12 have a property to be attracted to a magnet. Also, the inductor 11 and the transformer 12 have a height higher than other electronic components mounted on the SMD 10, so that they come into direct contact with the magnet panel 20 when the magnet panel 20 is put thereon from above. Leads 13 to 18 are provided under the SMD 10.

The magnet panel 20 formed of the permanent magnet is mounted on top of the SMD 10 having the configuration as described above. The magnet panel 20 has two different polarities divided in the vertical direction. In other words, if the upper surface of the magnet panel 20 is an N-pole, a lower surface is an S-pole. In contrast, if the upper surface is the S-pole, the lower surface is the N-pole.

In FIG. 2, although the magnet panel 20 has a rectangular shape, it may have a circular shape or other shapes. The upper surface of the magnet panel 20 has a flat area having at least a surface area of an extent which allows a sucking nozzle of the chip mounter to be attracted thereto secured as a nozzle attracting point 21. The nozzle attracting point 21 is provided above the center of gravity of a mass system including the magnet panel 20 and the SMD 10. By causing the sucking nozzle to be attracted to the nozzle attracting point 21 above the center of gravity, the SMD 10 may be maintained horizontally when moving the SMD 10. Since the magnet panel 20 may be formed of a homogeneous substance (the center of gravity may be set at the center of the magnet panel 20), if the center of gravity of the SMD 10 by itself is positioned substantially at the center of the SMD 10, the nozzle attracting point 21 comes to the center portion of the magnet panel 20.

The lower surface of the magnet panel 20 is preferably flat at least at an area which comes into contact with the inductor 11 and the transformer 12. However, if a sufficient magnetic force for lifting and moving the SMD 10 is secured, the area which comes into contact with the inductor 11 and the transformer 12 does not have to be completely flat. For example, there may be pits and projections or a curve to some extent on the lower surface of the magnet panel 20.

When the magnet panel 20 in this configuration is arranged on the upper surface of the SMD 10, the magnet panel 20 and the magnetic components (the inductor 11 and the transformer 12) attract to each other by the magnetic force. Consequently, the magnet panel 20 is fixed to the upper surface of the SMD 10.

Subsequently, the SMD 10 with the magnet panel 20 fixed thereon is mounted on the chip mounter.

Figure 3:
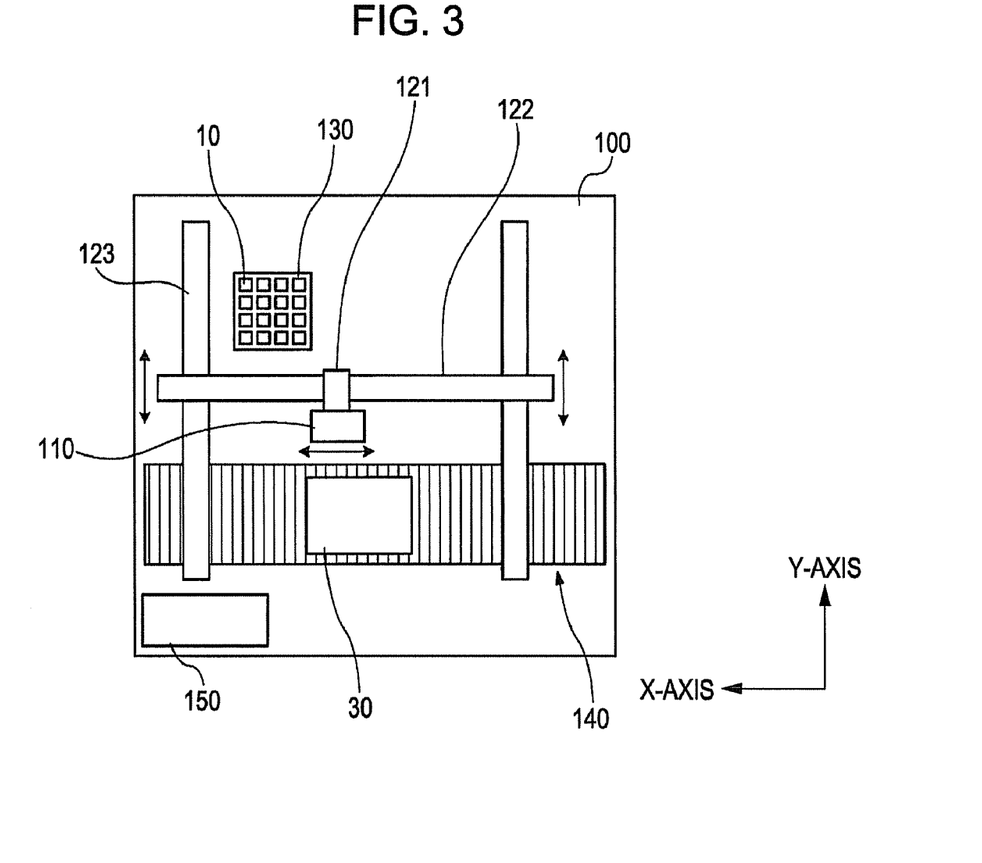
FIG. 3 is a drawing illustrating an example of a structure of a chip mounter.

FIG. 3 is a drawing depicting an example of a structure of the chip mounter. A chip mounter 100 includes a sucking head 110 configured to attract the SMD 10 and place the same on the printed circuit board 30. The sucking head 110 is able to attract the magnet panel 20 by the sucking nozzle provided at a distal end thereof.

The sucking head 110 is movably mounted on a Z-axis transfer unit 121. The Z-axis transfer unit 121 moves the sucking head 110 in the vertical direction (in a Z-axis direction) according to an instruction from a control unit 150. The Z-axis transfer unit 121 is movably mounted on an X-axis transfer unit 122. The X-axis transfer unit 122 moves the Z-axis transfer unit 121 in a X-axis direction according to an instruction from the control unit 150. The X-axis transfer unit 122 is movably mounted on an Y-axis transfer unit 123. The Y-axis transfer unit 123 moves the X-axis transfer unit 122 in a Y-axis direction according to an instruction from the control unit 150.

The chip mounter 100 has a fixed position for installing a component tray 130. The component tray 130 is installed at a predetermined position in the state in which a plurality of SMDs 10 are stored. A substrate transfer unit 140 transfers the printed circuit board 30 according to an instruction from the control unit 150.

The control unit 150 controls the action of the entire chip mounter 100 in response to an instruction to mount the SMD 10 by an operation input. More specifically, the control unit 150 controls the substrate transfer unit 140 after having set the component tray 130 having the SMDs 10 stored therein to move the printed circuit board 30 to the predetermined position. Subsequently, the control unit 150 controls the Z-axis transfer unit 121, the X-axis transfer unit 122, and the Y-axis transfer unit 123 to move the sucking head 110 to a position of the predetermined SMD 10 in the component tray 130. In addition, the control unit 150 controls the sucking head 110 to cause the same to attract the magnet panel 20 fixed on top of the SMD 10. Since the magnet panel 20 and the SMD 10 are fixed by the magnetic force, the SMD 10 is moved in association with the sucking head 110 from then on.

After having caused the sucking head 110 to attract the magnet panel 20, the control unit 150 controls the Z-axis transfer unit 121, the X-axis transfer unit 122, and the Y-axis transfer unit 123 to position the SMD 10 to a predetermined position on the printed circuit board 30. Subsequently, the control unit 150 controls the sucking head 110 to release the magnetic panel 20 attracted to the sucking head.

In this manner, an automatic mounting of the SMD 10 to the printed circuit board 30 by the chip mounter 100 is performed.

Figure 4:
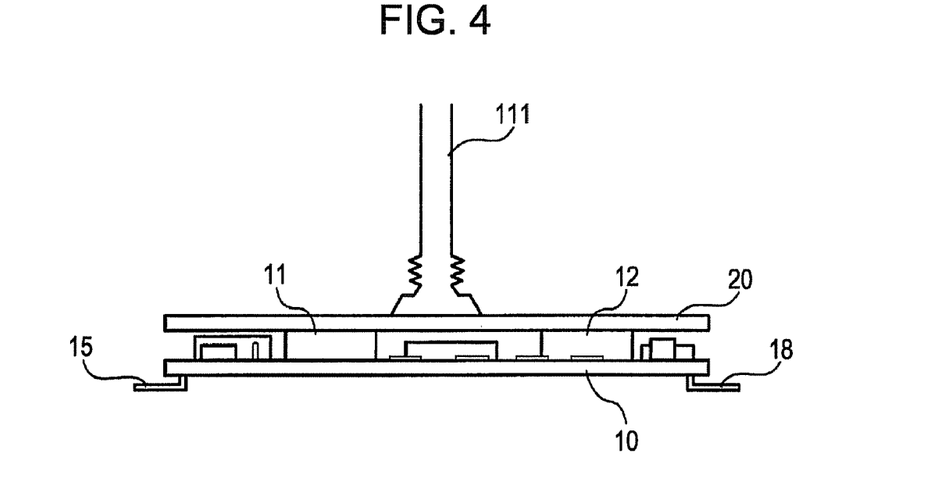
FIG. 4 is a drawing illustrating an attracting state by a sucking nozzle.

FIG. 4 is a drawing depicting a condition where the sucking nozzle is attracting the magnet panel. When the sucking head 110 is moved to the position of the SMD 10, a sucking nozzle 111 is positioned so that the sucking nozzle 111 at the distal end of the sucking head 110 matches the nozzle attracting point 21 on the upper surface of the magnet panel 20 (see FIG. 2). Then, the magnet panel 20 is attracted to the nozzle attracting point 21. In other words, the chip mounter 100 decompresses the interior of the sucking nozzle 111 to produce a vacuum. Accordingly, the sucking nozzle 111 and the magnet panel 20 are attracted to each other.

Since the magnet panel 20 is fixed to the inductor 11 and the transformer 12 by the magnetic force, if the magnet panel 20 is lifted upward by the sucking nozzle 111, the SMD 10 is also lifted simultaneously. Therefore, the chip mounter 100 moves the sucking head 110 and positions the SMD 10 onto the printed circuit board 30.

Figure 5:
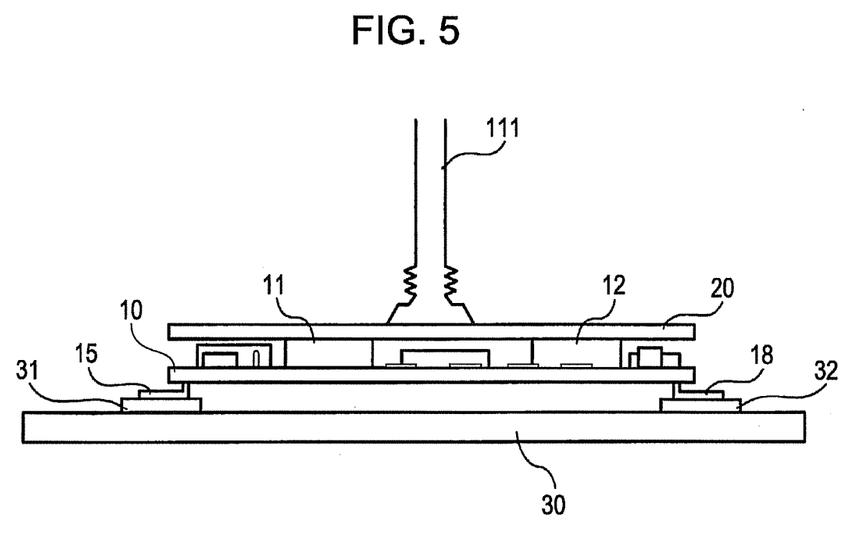
FIG. 5 is a drawing illustrating a printed board on which the SMD is mounted.

FIG. 5 is a drawing depicting a printed board on which the SMD is mounted. The SMD 10 is positioned so that the leads 15, 18 are on top of the solders 31, 32 on the printed circuit board 30. The chip mounter 100 breaks the vacuum in the interior of the sucking nozzle 111 to release the magnet panel 20 from the sucking nozzle 111.

The printed circuit board 30 having the SMD 10 mounted thereon is put into the reflow furnace and heated. Then, the solders 31, 32 melt. Then, the temperature of the printed circuit board 30 is lowered by cold air. Consequently, the leads 13 to 18 of the SMD 10 are soldered to the printed circuit board 30.

Figure 6:
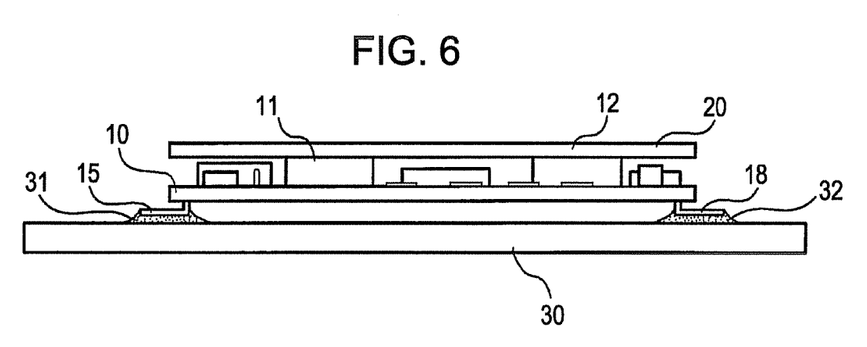
FIG. 6 is a drawing illustrating the printed board on which the SMD is soldered.

FIG. 6 is a drawing depicting the printed board on which the SMD is soldered. The leads 15, 18 of the SMD 10 are joined by the solders 31, 32 provided on the printed circuit board 30. Although not depicted, other leads 13, 14, 16 and 17 (see FIG. 2) are also joined by the solder. Subsequently, the magnet panel 20 fixed to the SMD 10 is removed.

Figure 7:
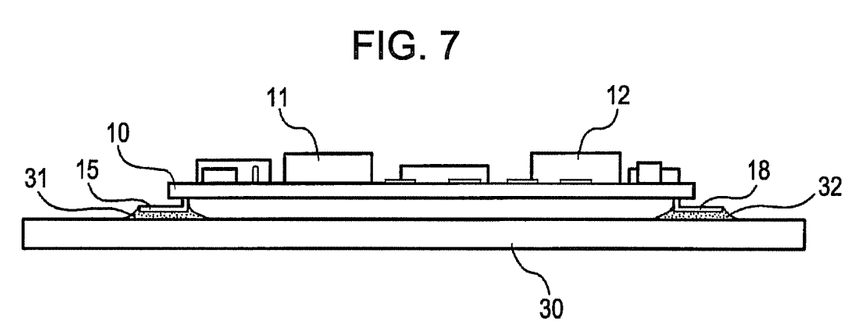
FIG. 7 is a drawing illustrating a state after removal of the magnet panel.

FIG. 7 is a drawing depicting a state after removal of the magnet panel. Since the SMD 10 is fixed firmly to the printed circuit board 30 by the solders 31, 32, the magnet panel 20 can be separated from the SMD 10 by pulling the magnet panel 20 from above.

As described above, by joining the magnet panel 20 with the magnetic components (the inductor 11, the transformer 12) on the large-sized SMD 10, even though there is no space to allow the nozzle to attract at the center portion of the SMD 10, automatic mounting of the SMD 10 on the printed circuit board 30 is achieved by the chip mounter 100 using a nozzle attracting mechanism.

Accordingly, an optimal arrangement of the components is achieved without considering the position to allow the sucking nozzle to attract, and formation of the dead spaces is eliminated. Consequently, easy downsizing of the SMD is achieved.

Also, optimization of the arrangement of the components is achieved in terms of the electricity, the cooling property, and the structure. Consequently, the improvement of the function of the SMD is expected.

Also, removal of the magnet panel 20 is easily achieved after the reflow. In other words, attachment and detachment of the magnet panel are easy. In addition, since such event that the adhesive agent remains thereon does not occur, the operation to remove the adhesive agent is not necessary and the number of steps is significantly reduced in comparison with the case in which the flat portion is formed by affixing the adhesive agent.

In addition, a special manufacturing equipment such as the double nozzle chip mounter does not have to be prepared. In other words, the chip mounter 100 having a single nozzle in the related art may be used. Therefore, a large-scale additional investment is not necessary.

The SMD 10 having the magnetic substance may be mounted on the printed board by the chip mounter configured to handle the electronic component by a magnetic chuck formed of an electromagnet. However, a mounter in which the magnet chuck is employed can hardly handle various types of SMDs. In contrast, with the mounting method according to this embodiment, various sizes of the SMDs may be mounted by the single chip mounter 100 including the sucking head used therein only by mounting the magnet panel 20 on the large-sized SMD 10. Therefore, the general versatility of the chip mounter 100 including the sucking head used therein is further enhanced.

In a second embodiment, with the provision of a stud having a property to be attracted to the SMD (for example, iron), the binding power between the magnet panel and the SMD is enhanced.

Figure 8:
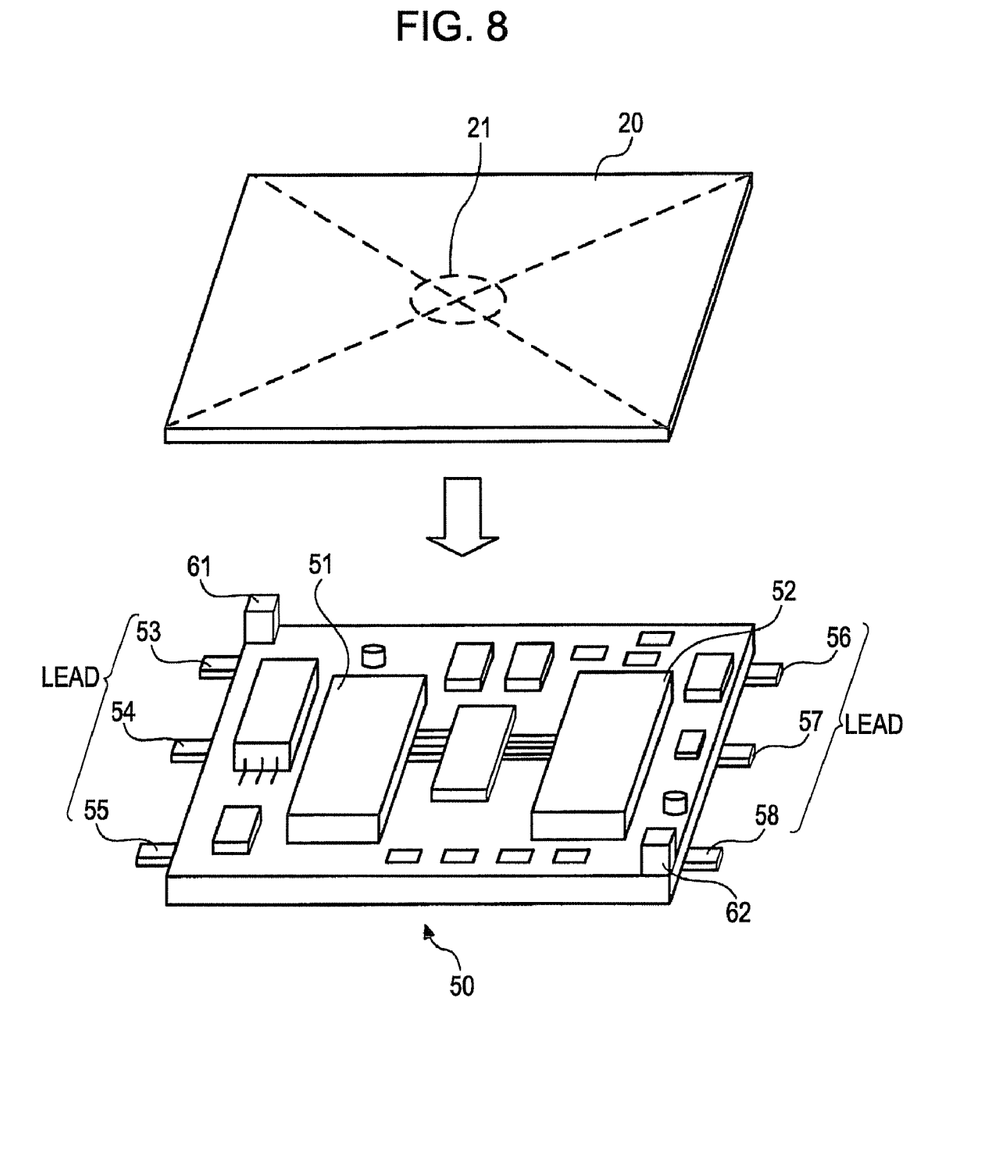
FIG. 8 is a drawing illustrating a mounting state of the magnet panel on the stud on the SMD.

FIG. 8 is a drawing depicting a mounting state of the magnet panel on the stud on the SMD. An electronic component including an inductor 51 and a transformer 52 is mounted on top of a circuit substrate of a SMD 50. Leads 53 to 58 are provided under the SMD 50. Studs 61, 62 are mounted on a pair of corners in a diagonal relationship on top of the circuit substrate of the SMD 50.

The studs 61, 62 are column shaped magnetic substances. For example, ferromagnetic material such as iron is used as the studs 61, 62. The studs 61, 62 depicted in FIG. 8 have a square pole shape. However, studs in a circular column shape may be used as well.

The studs 61, 62 have a height not lower than the inductor 51 and the transformer 52. Accordingly, when the magnet panel 20 is put thereon, the studs 61, 62 and the magnet panel 20 are in direct contact with each other, so that enhancement of the magnetic forces attracting each other is achieved.

The magnet panel 20 formed of the permanent magnet is mounted on top of the SMD 50 having the configuration as described above. The studs 61, 62 are magnetized by a magnetic field generated by the magnet panel 20. The studs 61, 62 and the magnet panel 20 are attracted by each other, and the magnet panel 20 is fixed to the SMD 50.

Figure 9:
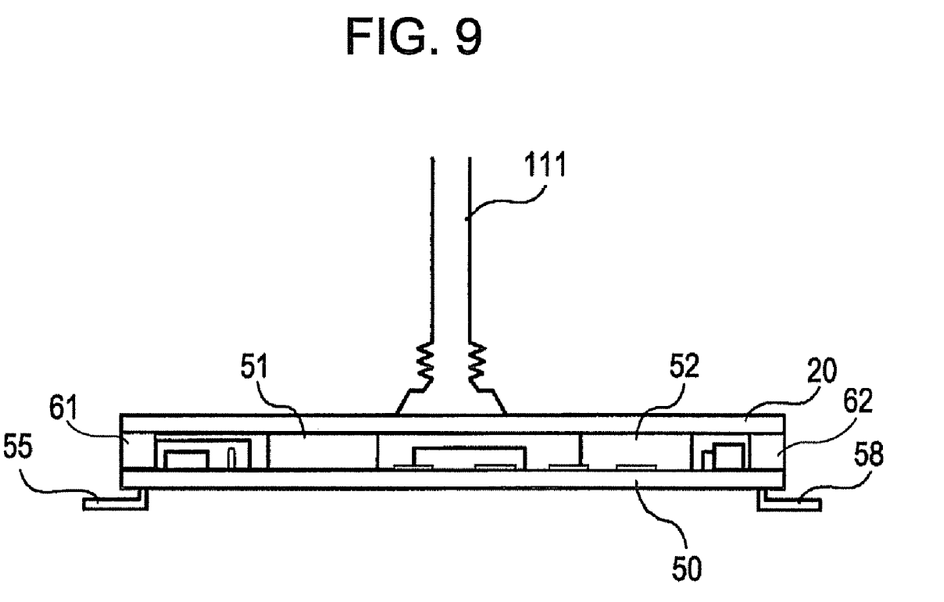
FIG. 9 is a drawing illustrating the attracting state by the attracting nozzle.

FIG. 9 is a drawing depicting a condition where the sucking nozzle is attracting the magnet panel. A sucking nozzle 111 is attracted to the nozzle attracting point 21 (see FIG. 8) of the magnet panel 20.

With the provision of the studs 61, 62 on the SMD 50 in this manner, the magnet panel 20 may be bound even though there is no adequate magnetic component on the SMD 50. The steps from then on are the same as those in the first embodiment depicted in FIG. 1.

In the example depicted in FIGS. 8 and 9, the studs 61, 62 are provided only on one pair of corners in a diagonal relationship of the SMD 50, the studs may be provided at all the corners.

Permanent magnets may be used as the studs 61, 62. In this case, they are mounted in such a manner that the magnetic pole which attracts the magnetic pole of the lower surface of the magnet panel 20 comes on the upper side of the studs 61, 62.

In addition, in the example depicted in FIGS. 8 and 9, the studs 61, 62 are provided on the SMD 50. However, a configuration in which the studs are provided on the opposite corners on the lower surface of the magnet panel 20 is also possible. In this case, pads formed of the magnetic substance are provided at least at the pair of corners in a diagonal relationship (positions which match the studs of the magnet panel 20) on the upper surface of the SMD 50.

In this manner, with the provision of the studs 61, 62 in advance on the SMD 50, the fixation of the magnet panel 20 is achieved even though the magnetic component is not included in the components to be mouthed in order to realize the function of the SMD 50.

As described in the embodiments depicted above, by mounting the magnet panel on the SMD and causing the magnet panel to be attracted by the sucking nozzle, the dead space formed on the SMD is minimized, so that downsizing of the SMD product is easily achieved.

Incidentally, there is a case where makers of the electronic circuit module purchases SMDs from external dealers and mounts the purchased SMDs on printed boards in their own factories. In such a case, manufacturers of the SMDs may mount the magnet panels on top of the SMDs. In other words, the manufactures of the SMDs deliver the SMDs in the form having the magnet panel mounted on top thereof to the makers of the electronic circuit modules. Accordingly, the makers of the electronic circuit modules are able to save themselves the work of mounting the magnet panels.

The present invention is not limited to the embodiments described above, and various modifications may be made without departing from the scope of the invention.

All examples and conditional language recited herein are intended for pedagogical purposes to aid the reader in understanding the invention and the concepts contributed by the inventor to furthering the art, and are to be construed as being without limitation to such specifically recited examples and condition, nor does the organization of such examples in the specification relate to a showing of superiority and inferiority of the invention. Although embodiments of the present inventions have been described in detail, it should be understood that the various changes, substitutions, and alternations could be made hereto without departing from the spirit and scope of the invention.

What is claimed is:

1. A method for mounting an electronic component on a printed circuit board, comprising:
    magnetically and removably attaching a first surface of a magnet panel directly to a magnetic body on a, first surface of an electronic component;
    attracting a second, opposite surface of the magnet panel to a mounter;
    moving the magnet panel to a printed circuit board;
    positioning a second, opposite surface of the electronic component on a first surface of the printed circuit board;
    releasing the mounter from the second surface of the magnet panel; and
    removing the magnet panel from the electronic component.

2. The method of claim 1, wherein the positioning further comprises placing the magnet panel above a center of gravity of a mass system including the magnet panel and the electronic component.

3. The method of claim 1, further comprising selecting the electronic component to be an inductor.

4. The method of claim 1, further comprising selecting the electronic component to be a transformer.

5. The method of claim 1, further comprising selecting the magnetic body to be at least two studs positioned directly between the magnet panel and the electronic component.

6. The method of claim 1, further selecting a height of the magnetic body to be greater than any other height of the electronic component.

7. The method of claim 1, further comprising selecting the magnet panel to have two different polarities.

8. The method of claim 1, further selecting the magnet panel to have a rectangular shape.

9. The method of claim 1, further selecting the first surface of the magnet to be flat.

10. A method for mounting an electronic component on a printed circuit board, comprising:
    magnetically and removably attaching a first surface of a magnet panel directly to a magnetic body on a, first surface of an electronic component;
    attracting a second, opposite surface of the magnet panel to a mounter;
    moving the magnet panel to a printed circuit board;
    positioning a second, opposite surface of the electronic component on a first surface of the printed circuit board;
    releasing the mounter from the second surface of the magnet panel; non-removably fixing the electronic component to the printed circuit board; and
    removing the magnet panel from the electronic component.

11. The method of claim 10, wherein the positioning further comprises placing the magnet panel above a center of gravity of a mass system including the magnet panel and the electronic component.

12. The method of claim 10, further comprising selecting the electronic component to be an inductor.

13. The method of claim 10, further comprising selecting the electronic component to be a transformer.

14. The method of claim 10, further comprising selecting the magnetic body to be at least two studs positioned directly between the magnet panel and the electronic component.

15. The method of claim 10, further selecting a height of the magnetic body to be greater than any other height of the electronic component.

16. The method of claim 10, further comprising selecting the magnet panel to have two different polarities.

17. The method of claim 10, further comprising selecting the magnet panel to have a rectangular shape.

18. The method of claim 10, further selecting the first surface of the magnet panel to be flat.

19. The method of claim 10, wherein the fixing includes soldering.

20. The method of claim 10, further comprising selecting the attracting to be suctioning.

* * * * *

UNITED STATES PATENT AND TRADEMARK OFFICE
CERTIFICATE OF CORRECTION

PATENT NO.        : 8,347,494 B2
APPLICATION NO.   : 12/570092
DATED             : January 8, 2013
INVENTOR(S)       : Yusaku Fujiishi et al.

Page 1 of 1

It is certified that error appears in the above-identified patent and that said Letters Patent is hereby corrected as shown below:

Column 7, Line 64, In Claim 1, delete "a," and insert -- a --, therefor.
Column 8, Line 31, In Claim 10, delete "a," and insert -- a --, therefor.

Signed and Sealed this
Twenty-sixth Day of March, 2013

Teresa Stanek Rea
*Acting Director of the United States Patent and Trademark Office*